United States Patent
Uchida (10) Patent No.: US 7,773,353 B2
(45) Date of Patent: Aug. 10, 2010

(54) POWER SUPPLY DEVICE, ELECTRICALLY-DRIVEN VEHICLE INCORPORATING POWER SUPPLY DEVICE, AND METHOD OF CONTROLLING POWER SUPPLY DEVICE

(75) Inventor: Kenji Uchida, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 193 days.

(21) Appl. No.: 12/087,681

(22) PCT Filed: Feb. 1, 2007

(86) PCT No.: PCT/JP2007/052171

§ 371 (c)(1),
(2), (4) Date: Jul. 11, 2008

(87) PCT Pub. No.: WO2007/089037

PCT Pub. Date: Aug. 9, 2007

(65) Prior Publication Data

US 2009/0002903 A1 Jan. 1, 2009

(30) Foreign Application Priority Data

Feb. 3, 2006 (JP) .............................. 2006-026947

(51) Int. Cl.
*H02H 3/00* (2006.01)
*H02H 9/08* (2006.01)
*G01R 31/00* (2006.01)
*G01R 31/08* (2006.01)

(52) U.S. Cl. .................... 361/49; 324/503; 324/512; 324/522; 324/523; 324/525

(58) Field of Classification Search .................... 361/49
See application file for complete search history.

(56) References Cited

U.S. PATENT DOCUMENTS 5,760,488 A * 6/1998 Sonntag ..................... 307/10.1

(Continued)

FOREIGN PATENT DOCUMENTS

DE 195 03 749 C1 4/1996

(Continued)

OTHER PUBLICATIONS

Decision on Grant issued in Russian Patent Application No. 2008135710 issued on Mar. 5, 2010 (with English-Language Translation).

*Primary Examiner*—Stephen W Jackson
*Assistant Examiner*—Dharti H Patel
(74) *Attorney, Agent, or Firm*—Oliff & Berridge, PLC (57) ABSTRACT

An ECU determines based on a voltage from an insulation resistance decrease detector whether the insulation resistance of a power supply device decreases or not. When a load external to the vehicle is not connected to the power supply device, the ECU sets a determination threshold value for determining that the insulation resistance decreases to a normal first value. On the other hand, when the load external to the vehicle is electrically connected to the power supply device, the ECU sets the determination threshold value to a second value which is lower than the first value, in consideration of an increase in the capacitive component due to a capacitor of a Y-capacitor.

18 Claims, 6 Drawing Sheets

U.S. PATENT DOCUMENTS

| | | | |
|---|---|---|---|
| 6,906,525 B2 * | 6/2005 | Suzuki | 324/509 |
| 7,005,860 B2 * | 2/2006 | Yamamoto et al. | 324/527 |
| 2002/0121902 A1 | 9/2002 | Suzuki | |
| 2004/0130326 A1 * | 7/2004 | Yamamoto | 324/503 |

FOREIGN PATENT DOCUMENTS

| | | |
|---|---|---|
| EP | 1 555 536 A2 | 7/2005 |
| JP | A 08-294225 | 11/1996 |
| JP | A 10-290529 | 10/1998 |
| JP | A 2005-348483 | 12/2005 |
| RU | 2 175 138 C1 | 10/2001 |
| RU | 2 263 383 C1 | 10/2005 |
| WO | WO 2005/005770 A1 | 1/2005 |

* cited by examiner

POWER SUPPLY DEVICE, ELECTRICALLY-DRIVEN VEHICLE INCORPORATING POWER SUPPLY DEVICE, AND METHOD OF CONTROLLING POWER SUPPLY DEVICE

TECHNICAL FIELD

The present invention relates to a power supply device incorporated in an electrically-driven vehicle, the electrically-driven vehicle incorporating the power supply device, and a method of controlling the power supply device incorporated in the electrically-driven vehicle.

BACKGROUND ART

Japanese Patent Laying-Open No. 10-290529 discloses a power supply device incorporated in an electric vehicle. The power supply device includes a battery, an electric circuit system such as a running motor and an on-vehicle auxiliary machine supplied with power from the battery, an inverter circuit for generating a commercial alternating-current (AC) voltage that converts a direct-current (DC) voltage from the battery to a commercial AC voltage for application to a commercial power supply load, a cutoff switch provided between the inverter circuit and the commercial power supply load, and a leakage detecting circuit that detects a ground-fault current leaking from the battery so as to detect leakage of the electric circuit system.

In this power supply device, upon detection of the leakage, the leakage detecting circuit stops the inverter circuit and causes the cutoff switch to operate to cut off the power feeding to the commercial power supply load, without interrupting the power feeding to the electric circuit system such as the running motor and the on-vehicle auxiliary machine.

Due to the effect of the capacitive component of the commercial power supply load, the impedance varies between the case where the commercial power supply load is electrically connected to the power supply device and the case where the commercial power supply load is not connected to the power supply device. In the above-mentioned Japanese Patent Laying-Open No. 10-290529, however, the variations in impedance due to the effect of the capacitive component of the commercial power supply load is not taken into consideration. Thus, the decrease in insulation resistance of the power supply device cannot be accurately detected.

DISCLOSURE OF THE INVENTION

The present invention is directed to solve the above-described problem. An object of the present invention is to provide a power supply device capable of accurately detecting the decrease in the insulation resistance.

Furthermore, another object of the present invention is to provide an electrically-driven vehicle which incorporates a power supply device capable of accurately detecting the decrease in the insulation resistance.

Still another object of the present invention is to provide a method of controlling a power supply device capable of accurately detecting the decrease in the insulation resistance.

According to the present invention, a power supply device is incorporated in an electrically-driven vehicle. The power supply device includes a power storage device, an electric power conversion device and a detection device. The electric power conversion device is configured to allow at least one of power feeding from the power storage device to a load external to the vehicle and charging from the load to the power storage device to be performed. The detection device detects a decrease in the insulation resistance of the power supply device. When the load is connected to the electric power conversion device, the detection device sets a determination threshold value for detecting the decrease in the insulation resistance to a value lower than the determination threshold value in the non-connected state of the load to the electric power conversion device.

Preferably, the determination threshold value when the load is connected to the electric power conversion device is determined based on the capacitance of the load.

Preferably, when the load is connected to the electric power conversion device, the detection device sets a determination period for defining the decrease in the insulation resistance to a period shorter than the determination period in the non-connected state.

Preferably, the power supply device further includes a shutdown unit. The shutdown unit shuts down the system of the electrically-driven vehicle when the decrease in the insulation resistance is detected in the case where the load is connected to the electric power conversion device.

Preferably, the load includes a line-bypass capacitor. The line-bypass capacitor is connected between ground and a power line pair connected to the electric power conversion device.

Preferably, the detection device includes a resistance element, a voltage generating device, a capacitive element, a voltage detection device, a setting unit, and a determination unit. The resistance element has a predetermined resistance value. The voltage generating device is connected between the resistance element and vehicle ground, and generates a voltage having a predetermined frequency. The capacitive element is connected between the resistance element and an electric power line of the power supply device. The voltage detection device detects the voltage between the resistance element and the capacitive element. The setting unit sets the determination threshold value. The determination unit determines that the insulation resistance decreases, based on the voltage detected by the voltage detection device and the determination threshold value set by the setting unit.

Preferably, the electric power conversion device includes first and second AC electric motors, first and second inverters, an inverter control device, and a connecting device. Each of the first and second AC electric motors includes a star-connected polyphase winding as a stator winding. The first and second inverters are provided corresponding to the first and second AC electric motors, respectively, and transmit and receive electric power to and from the power storage device. The inverter control device controls the first and second inverters. The connecting device is provided to connect the load to a neutral point of the polyphase winding when one of power feeding from the power storage device to the load and charging from the load to the power storage device is performed.

According to the present invention, the electrically-driven vehicle incorporates any of the above-described power supply devices.

Furthermore, according to the present invention, a control method of a power supply device corresponds to a method of controlling a power supply device incorporated in an electrically-driven vehicle. The power supply device includes a power storage device, an electric power conversion device and a detection device. The electric power conversion device is configured to allow at least one of power feeding from the power storage device to a load external to the vehicle and charging from the load to the power storage device to be performed. The detection device detects a decrease in insulation resistance of the power supply device. The control method of the power supply device includes first and second steps. In the first step, it is determined whether or not the load is connected to the electric power conversion device. In the second step, if it is determined that the load is connected to the electric power conversion device, a determination threshold value for detecting the decrease in the insulation resistance is set to a value lower than the determination threshold value in the non-connected state of the load to the electric power conversion device.

Preferably, the determination threshold value when the load is connected to the electric power conversion device is determined based on the capacitance of the load.

Preferably, the control method of the power supply device further includes a third step. In the third step, if it is determined that the load is connected to the electric power conversion device, a determination period for defining the decrease in the insulation resistance is set to a period shorter than the determination period in the non-connected state.

Preferably, the control method of the power supply device further includes a fourth step. In the fourth step, if the detection device detects the decrease in the insulation resistance in the case where the load is connected to the electric power conversion device, the system of the electrically-driven vehicle is shut down.

In the present invention, when the load external to the vehicle is not connected to the electric power conversion device, the decrease in the insulation resistance is detected based on the normal determination threshold value. When the load is connected to the electric power conversion device, in consideration of the decrease in the impedance resulting from the addition of the capacitive component of the load, the determination threshold value is set to a value lower than the determination threshold value in the non-connected state, to detect the decrease in the insulation resistance.

Therefore, according to the present invention, the decrease in the insulation resistance can be accurately detected.

Furthermore, in the present invention, when the load is connected to the electric power conversion device, the determination period for defining the decrease in the insulation resistance is set to a period shorter than the determination period in the non-connected state.

Therefore, according to the present invention, in the case where the abnormality including the insulation resistance decrease occurs when the load is connected to the electric power conversion device, the abnormality can be detected at an early stage.

BEST MODES FOR CARRYING OUT THE INVENTION

The embodiments of the present invention will be hereinafter described in detail with reference to the accompanying drawings, in which the same or corresponding components are designated by the same reference characters, and description thereof will not be repeated.

First Embodiment

Figure 1:
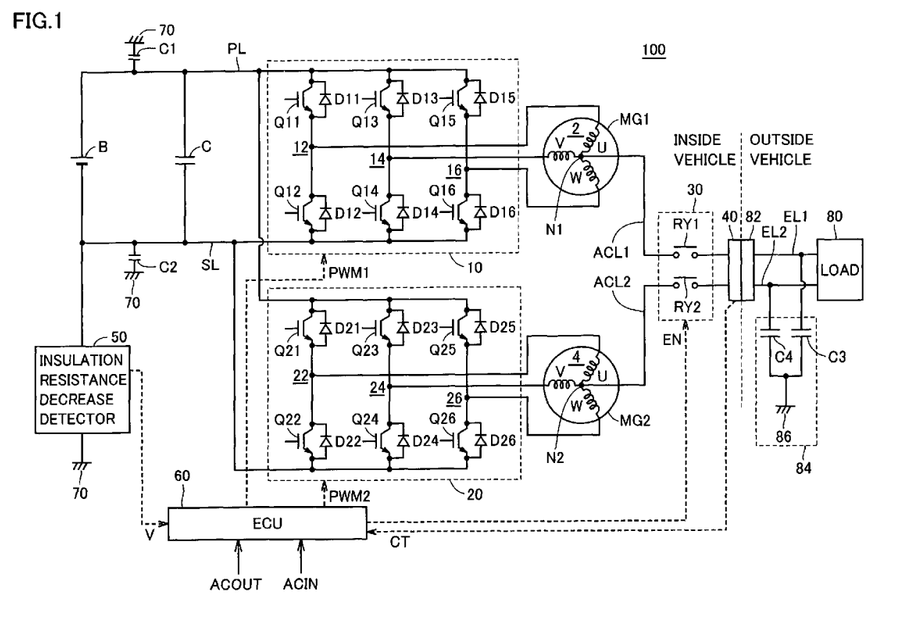
FIG. 1 is an overall block diagram of a power supply device according to a first embodiment of the present invention.

FIG. 1 is an overall block diagram of a power supply device according to the first embodiment of the present invention. Referring to FIG. 1, the power supply device 100 includes a power storage device B, a smoothing capacitor C, inverters 10 and 20, motor generators MG1 and MG2, a power supply line PL, and a ground line SL. Power supply device 100 also includes AC lines ACL1 and ACL2, a relay circuit 30, a connector 40, an insulation resistance decrease detector 50, and an electronic control unit (also referred to as an "ECU" hereinafter) 60.

Power supply device 100 is incorporated into a hybrid vehicle. Motor generator MG1 is incorporated into the hybrid vehicle as one that operates as an electric motor capable of starting an engine (not shown) and operates as an electric generator driven by the engine. Motor generator MG2 is incorporated into the hybrid vehicle as an electric motor driving the driving wheels of the hybrid vehicle (not shown).

The hybrid vehicle incorporating power supply device 100 may be of a series/parallel type which is capable of splitting the power of the engine by a power split mechanism for transmission to the axle and motor generator MG1, and may be of a series type with which the engine is used only for driving motor generator MG1 and the driving force of the axle is generated only by motor generator MG2 using the electric power generated by motor generator MG1.

The positive electrode of power storage device B is connected to power supply line PL. The negative electrode of power storage device B is connected to ground line SL. Smoothing capacitor C is connected between power supply line PL and ground line SL. Insulation resistance decrease detector 50 is connected between ground line SL and body ground 70 of the vehicle.

Inverter 10 includes a U-phase arm 12, a V-phase arm 14 and a W-phase arm 16. U-phase arm 12, V-phase arm 14 and W-phase arm 16 are connected in parallel between power supply line PL and ground line SL. U-phase arm 12 is formed of power transistors Q11 and Q12 connected in series, V-phase arm 14 is formed of power transistors Q13 and Q14 connected in series, and W-phase arm 16 is formed of power transistors Q15 and Q16 connected in series. Diodes D11-D16 are connected across the collector and the emitter of each of power transistors Q11-Q16, respectively, to cause a current to flow from the emitter side to the collector side.

Inverter 20 includes a U-phase arm 22, a V-phase arm 24 and a W-phase arm 26. U-phase arm 22, V-phase arm 24 and W-phase arm 26 are connected in parallel between power supply line PL and ground line SL. U-phase arm 22 is formed of power transistors Q21 and Q22 connected in series, V-phase arm 24 is formed of power transistors Q23 and Q24 connected in series, and W-phase arm 26 is formed of power transistors Q25 and Q26 connected in series. Diodes D21-D26 are connected across the collector and the emitter of each of power transistors Q21-Q26, respectively, to cause a current to flow from the emitter side to the collector side.

Motor generator MG1 includes a Y-connected three-phase coil 2 as a stator coil. U-, V- and W-phase coils forming three-phase coil 2 each have one end connected to each other to form a neutral point N1, and the respective other ends of the U-, V- and W-phase coils are connected to the corresponding arms of inverter 10, respectively. Motor generator MG2 includes a Y-connected three-phase coil 4 as a stator coil. U-, V- and W-phase coils forming three-phase coil 4 each have one end connected to each other to form a neutral point N2, and the respective other ends of the U-, V- and W-phase coils are connected to the corresponding arms of inverter 20, respectively.

Relay circuit 30 includes relays RY1 and RY2. Relay RY1 has one end connected via AC line ACL1 to neutral point N1 of three-phase coil 2 of motor generator MG1, and the other end connected to connector 40. Relay RY2 has one end connected via AC line ACL2 to neutral point N2 of three-phase coil 4 of motor generator MG2, and the other end connected to connector 40.

At the time of transmission and reception of the electric power between power supply device 100 and a load 80 external to the vehicle, a connector 82 of load 80 external to the vehicle is connected to connector 40. Load 80 external to the vehicle is, for example, a household commercial power supply load and is connected to connector 82 through power supply lines EL1 and EL2.

A Y-capacitor 84 is connected to power supply lines EL1 and EL2. Y-capacitor 84 includes capacitors C3 and C4. Capacitor C3 is connected between power supply line EL1 and ground 86. Capacitor C4 is connected between power supply line EL2 and ground 86. Y-capacitor 84 is provided as a filter for removing common mode noise on power supply lines EL1 and EL2.

Power storage device B is a DC power supply and formed, for example, of a nickel-hydrogen or lithium-ion secondary battery. Power storage device B generates and outputs a DC voltage to power supply line PL, and is also charged by the DC voltage output from at least one of inverters 10 and 20. It is to be noted that a large-capacity capacitor may be used as power storage device B.

Capacitance C1 shows a capacitance between power supply line PL and body ground 70. Capacitance C2 shows a capacitance between ground line SL and body ground 70. Smoothing capacitor C smoothes voltage variations between power supply line PL and ground line SL.

Inverter 10, based on a signal PWM1 from ECU 60, converts the DC voltage received from power supply line PL to a three-phase AC voltage, and outputs the converted three-phase AC voltage to motor generator MG1. Inverter 10 also converts the three-phase AC voltage generated by motor generator MG1 receiving the output from the engine, to a DC voltage based on signal PWM1 from ECU 60, and outputs the converted DC voltage to power supply line PL.

When an AC output command ACOUT received by ECU 60 from an external ECU (not shown) is activated, inverter 10, based on signal PWM1 from ECU 60, controls the potential of neutral point N1 so as to generate a commercial AC voltage across neutral points N1 and N2 of three-phase coils 2 and 4 of motor generators MG1 and MG2.

Furthermore, when an AC input command ACIN received by ECU 60 from the external ECU is activated, inverter 10, based on signal PWM1 from ECU 60, rectifies the commercial AC voltage applied to neutral point N1 from load 80 external to the vehicle, and outputs the voltage to power supply line PL.

Inverter 20, based on a signal PWM2 from ECU 60, converts the DC voltage received from power supply line PL to a three-phase AC voltage, and outputs the converted three-phase AC voltage to motor generator MG2. During regenerative braking of the vehicle, inverter 20 also converts the three-phase AC voltage generated by motor generator MG2 to a DC voltage based on signal PWM2 from ECU 60, and outputs the converted DC voltage to power supply line PL.

When AC output command ACOUT received by ECU 60 from the external ECU is activated, inverter 20, based on signal PWM2 from ECU 60, controls the potential of neutral point N2 so as to generate a commercial AC voltage across neutral points N1 and N2 of three-phase coils 2 and 4 of motor generators MG1 and MG2.

Furthermore, when AC input command ACIN received by ECU 60 from the external ECU is activated, inverter 20, based on signal PWM2 from ECU 60, rectifies the commercial AC voltage applied to neutral point N2 from load 80 external to the vehicle, and outputs the voltage to power supply line PL.

Motor generators MG1 and MG2 are three-phase AC electric motors and include, for example, three-phase AC synchronous electric generators. Motor generator MG1 uses the output from the engine to generate a three-phase AC voltage, and outputs the generated three-phase AC voltage to inverter 10. Motor generator MG1 also generates a driving force by the three-phase AC voltage received from inverter 10, to start the engine. Motor generator MG2 generates a vehicle driving torque by the AC voltage received from inverter 20. During regenerative braking of the vehicle, motor generator MG2 generates and outputs a three-phase AC voltage to inverter 20.

Relay circuit 30 connects/disconnects AC lines ACL1 and ACL2 to/from connector 40 in accordance with an enable signal EN from ECU 60. Specifically, when relay circuit 30 receives enable signal EN of H (logic high) level from ECU 60, relays RY1 and RY2 are turned on to electrically connect AC lines ACL1 and ACL2 to connector 40. When relay circuit 30 receives enable signal EN of L (logic low) level from ECU 60, relays RY1 and RY2 are turned off to electrically disconnect AC lines ACL1 and ACL2 from connector 40.

Connector 40 is a terminal for connecting load 80 external to the vehicle to neutral points N1 and N2. At the time of transmission and reception of the electric power between power supply device 100 and load 80 external to the vehicle, connector 82 of load 80 external to the vehicle is connected to connector 40. When connector 82 is connected to connector 40, connector 40 outputs a signal CT of H level to ECU 60.

Insulation resistance decrease detector 50 is an apparatus for detecting a decrease in the insulation resistance of power supply device 100. Insulation resistance decrease detector 50 applies the voltage of square wave having a predetermined frequency to ground line SL and generates a voltage V which decreases with a decrease in the insulation resistance, to output the voltage to ECU 60, as described below. The configuration of insulation resistance decrease detector 50 will be described below.

ECU 60 generates signal PWM1 for driving motor generator MG1 based on the voltage on power supply line PL and the motor current and the torque command value of motor generator MG1, and outputs the generated signal PWM1 to inverter 10. Furthermore, ECU 60 generates signal PWM2 for driving motor generator MG2 based on the voltage on power supply line PL and the motor current and the torque command value of motor generator MG2, and outputs the generated signal PWM2 to inverter 20.

It is to be noted that the voltage on power supply line PL is detected by a voltage sensor (not shown) and the motor currents of motor generators MG1 and MG2 are detected by a current sensor (not shown). The torque command values of motor generators MG1 and MG2 are calculated by the external ECU based on the accelerator pedal position, the amount of stepping on the brake pedal, the charging state of the power storage device, and the like.

If AC output command ACOUT or AC input command ACIN is activated when signal CT is at H level, ECU 60 generates and outputs enable signal EN of H level to relay circuit 30. AC output command ACOUT is activated during the power feeding mode in which the commercial AC voltage is generated across neutral points N1 and N2 of three-phase coils 2 and 4 of motor generators MG1 and MG2 and supplied to load 80 external to the vehicle. AC input command ACIN is activated during the charging mode in which the commercial AC voltage applied to neutral points N1 and N2 from load 80 external to the vehicle is used to charge power storage device B.

If AC output command ACOUT is activated when signal CT is at H level, and ECU 60 outputs enable signal EN of H level to relay circuit 30 accordingly, ECU 60 generates signals PWM1 and PWM2 so as to generate a commercial AC voltage to neutral points N1 and N2, and outputs the generated signals PWM1 and PWM2 to inverters 10 and 20, respectively.

If AC input command ACIN is activated when signal CT is at H level, and ECU 60 outputs enable signal EN of H level to relay circuit 30 accordingly, ECU 60 generates signals PWM1 and PWM2 so as to rectify the commercial AC voltage applied to neutral points N1 and N2 from load 80 external to the vehicle to charge power storage device B. ECU 60 then outputs the generated signals PWM1 and PWM2 to inverters 10 and 20, respectively.

Furthermore, ECU 60 employs the method described below to determine whether the insulation resistance of power supply device 100 decreases or not, based on the peak value of voltage V from insulation resistance decrease detector 50. ECU 60 selects an appropriate determination threshold value for determining that the insulation resistance decreases, depending on whether or not load 80 external to the vehicle is electrically connected to power supply device 100. Specifically, when load 80 external to the vehicle is not connected to power supply device 100, ECU 60 sets the determination threshold value to Wth1. On the other hand, when load 80 external to the vehicle is electrically connected to power supply device 100, ECU 60 sets the determination threshold value to Wth2 which is lower than Wth1.

If ECU 60 determines that the insulation resistance decreases when load 80 external to the vehicle is not connected to power supply device 100, ECU 60 shifts the drive mode of the vehicle from the normal mode to the save drive mode. It is to be noted that the save drive mode corresponds to the drive mode in which the next startup of the vehicle system is disabled.

In addition, if ECU 60 determines that the insulation resistance decreases when load 80 external to the vehicle is connected to power supply device 100, ECU 60 immediately shuts down the vehicle system including power supply device 100.

Figure 2:
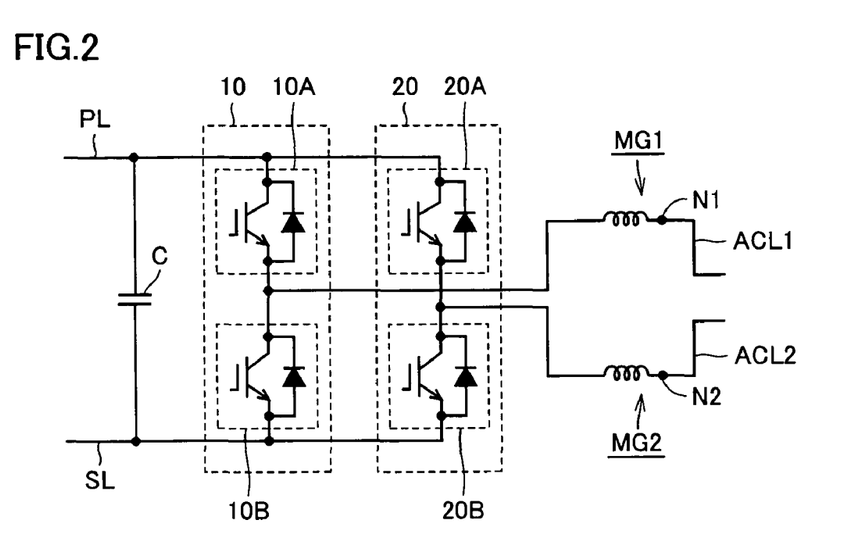
FIG. 2 shows a zero-phase equivalent circuit of inverters and motor generators shown in FIG. 1.

FIG. 2 shows a zero-phase equivalent circuit of inverters 10, 20 and motor generators MG1, MG2 shown in FIG. 1. In each of inverters 10 and 20 which are three-phase inverters, there are eight different combination patterns in which six transistors are turned on/off. In each of two of the eight switching patterns, the interphase voltage is zero, and such voltage state is referred to as zero-voltage vector. For the zero-voltage vector, three transistors of each upper arm can be regarded as in the same switching state (all on or all off), and three transistors of each lower arm can also be regarded as in the same switching state. Thus, in FIG. 2, the three transistors of each upper arm of inverter 10 are collectively represented as an upper arm 10A, and the three transistors of each lower arm of inverter 10 are collectively represented as a lower arm 10B. Similarly, the three transistors of each upper arm of inverter 20 are collectively represented as an upper arm 20A, and the three transistors of each lower arm of inverter 20 are collectively represented as a lower arm 20B.

As shown in FIG. 2, this zero-phase equivalent circuit can be regarded as a single-phase PWM inverter which uses the DC voltage supplied from power supply line PL to generate a single-phase AC voltage across neutral points N1 and N2. This zero-phase equivalent circuit can also be regarded as a single-phase PWM converter to which the single-phase AC commercial electric power supplied to neutral points N1 and N2 through AC lines ACL1 and ACL2 is input. Thus, by changing the zero-voltage vector in each of inverters 10 and 20 and performing switching control of inverters 10 and 20 such that inverters 10 and 20 operate as each phase arm of the single-phase PWM inverter or the single-phase PWM converter, it becomes possible to convert the DC power from power supply line PL to an AC power to output it from connector 40, and also possible to convert the AC commercial electric power input from connector 40 to a DC power to output it to power supply line PL.

Figure 3:
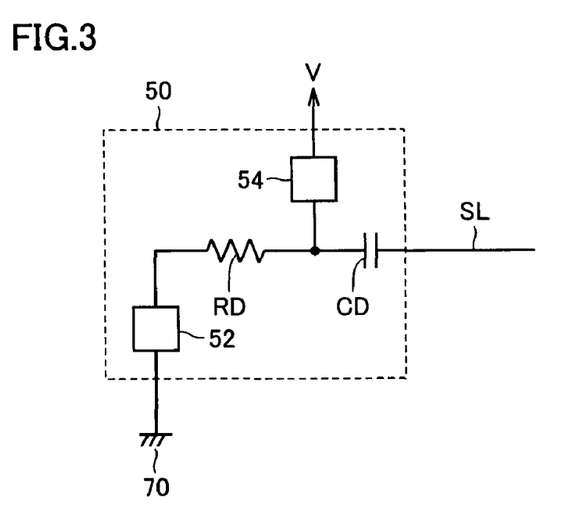
FIG. 3 shows a structure of an insulation resistance decrease detector shown in FIG. 1.

FIG. 3 shows a structure of insulation resistance decrease detector 50 shown in FIG. 1. Referring to FIG. 3, insulation resistance decrease detector 50 includes a square-wave generator 52, a resistance element RD, a capacitor CD, and a voltage sensor 54.

Square-wave generator 52 has one end connected to body ground 70 and the other end connected to resistance element RD. Resistance element RD has one end connected to square-wave generator 52 and the other end connected to capacitor CD. Capacitor CD has one end connected to resistance element RD and the other end connected to ground line SL.

Square-wave generator 52 generates a voltage of square wave of low voltage (for example, a few voltages) and low frequency (for example, a few Hz), and outputs the generated voltage to resistance element RD. Voltage sensor 54 detects voltage V between resistance element RD and capacitor CD, and outputs the detected voltage V to ECU 60 (not shown).

Figure 4:
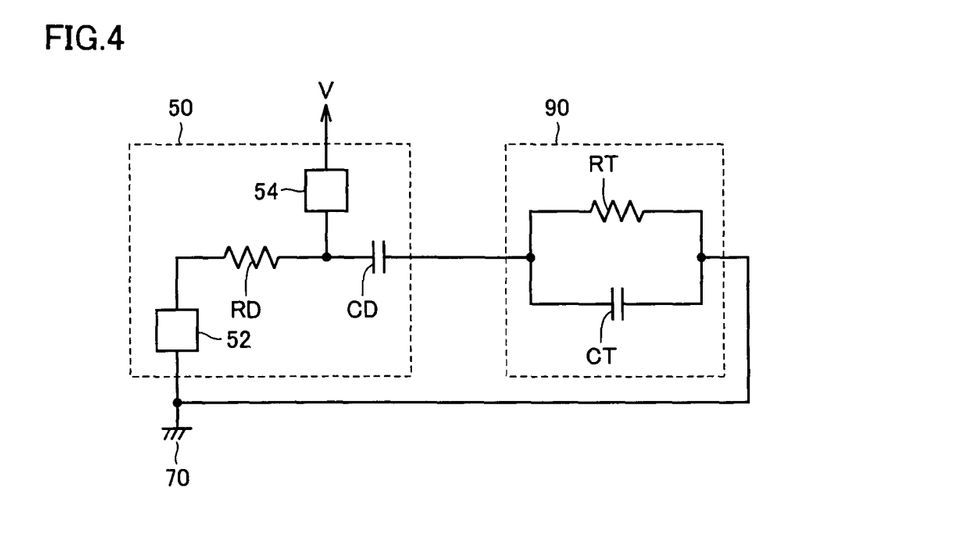
FIG. 4 is a diagram for illustrating the detection mechanism of the insulation resistance by the insulation resistance decrease detector shown in FIG. 3.

FIG. 4 is a diagram for illustrating the detection mechanism of the insulation resistance by insulation resistance decrease detector 50 shown in FIG. 3. Referring to FIG. 4, when load 80 external to the vehicle is not connected to power supply device 100, a system to be detected 90 accommodates power supply device 100. When load 80 external to the vehicle is electrically connected to power supply device 100, system to be detected 90 accommodates power supply device 100 and load 80 external to the vehicle as a whole.

A resistive component RT of system to be detected 90 shows the insulation resistance of power supply device 100. When load 80 external to the vehicle is not connected to power supply device 100, a capacitive component CT of system to be detected 90 is comprised of the sum of capacitance C1 and capacitance C2 shown in FIG. 1. When load 80 external to the vehicle is electrically connected to power supply device 100, capacitive component CT is comprised of the sum of capacitances C1, C2 and the capacitances of capacitors C3, C4 included in Y-capacitor 84.

Square-wave generator 52 of insulation resistance decrease detector 50 generates a voltage of square wave of low voltage and low frequency, and applies the generated voltage to system to be detected 90 via resistance element RD and capacitor CD. Resistive component RT showing the insulation resistance is decreased to cause the impedance of system to be detected 90 to decrease, which results in a decrease in voltage V between resistance element RD and system to be detected 90. Therefore, the decrease in the insulation resistance can be detected based on voltage V.

However, the impedance of system to be detected 90 varies depending on capacitive component CT. Specifically, in the state where load 80 external to the vehicle is electrically connected to power supply device 100, capacitive component CT is increased by capacitances of capacitors C3 and C4 included in Y-capacitor 84. Consequently, in the case where load 80 external to the vehicle is electrically connected to power supply device 100, the impedance of system to be detected 90 is lower than that in the non-connected state. Therefore, in the case where load 80 external to the vehicle is electrically connected to power supply device 100, voltage V is lower than that in the non-connected state, even without variations in the insulation resistance (resistive component RT).

Thus, in the first embodiment, in the case where load 80 external to the vehicle is electrically connected to power supply device 100 in the detection of the decrease in the insulation resistance based on voltage V from insulation resistance decrease detector 50, the determination threshold value for determining, based on voltage V, that the insulation resistance decreases is set to a value smaller than that in the non-connected state. This allows the decrease in the insulation resistance to be accurately detected.

Figure 5:
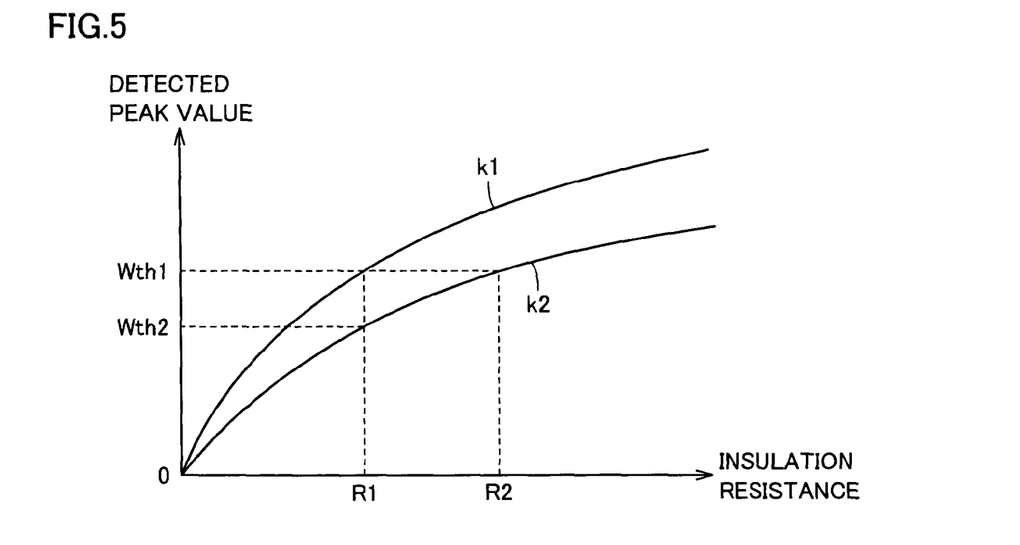
FIG. 5 is a diagram for illustrating the concept of setting a determination threshold value for determining that the insulation resistance decreases, based on the voltage from the insulation resistance decrease detector shown in FIG. 3.

FIG. 5 is a diagram for illustrating the concept of setting the determination threshold value for determining the decrease in the insulation resistance based on voltage V from insulation resistance decrease detector 50 shown in FIG. 3. Referring to FIG. 5, the horizontal axis shows the insulation resistance of power supply device 100, and the vertical axis shows the peak value of voltage V from insulation resistance decrease detector 50 (hereinafter referred to as a "detected peak value"). A curve k1 shows the relation between the insulation resistance and the detected peak value when load 80 external to the vehicle is not connected to power supply device 100, and a curve k2 shows the relation between the insulation resistance and the detected peak value when load 80 external to the vehicle is electrically connected to power supply device 100. As described above, due to the effect of capacitors C3 and C4 of Y-capacitor 84, the detected peak value (curve k2) when load 80 external to the vehicle is electrically connected to power supply device 100 is smaller than the detected peak value (curve k1) when load 80 external to the vehicle is not connected to power supply device 100.

If abnormality detection is desired when the insulation resistance is below R1, the determination threshold value of the detected peak value when load 80 external to the vehicle is not connected to power supply device 100 is set to Wth1 based on curve k1.

However, if this determination threshold value Wth1 is used when load 80 external to the vehicle is electrically connected to power supply device 100, the abnormality detection occurs when the insulation resistance is less than R2 which is greater than R1, based on curve k2. This causes abnormality detection to occur excessively.

Thus, the determination threshold value of the detected peak value when load 80 external to the vehicle is electrically connected to power supply device 100 is set to Wth2 corresponding to insulation resistance R1, based on curve k2. This allows the decrease in the insulation resistance to be accurately detected even when load 80 external to the vehicle is electrically connected to power supply device 100.

It is to be noted that curve k2 can be determined based on capacitors C3 and C4 of Y-capacitor 84 with reference to curve k1. Therefore, determination threshold value Wth2 of the detected peak value when load 80 external to the vehicle is electrically connected to power supply device 100 can be determined based on capacitors C3 and C4 of Y-capacitor 84.

Figure 6:
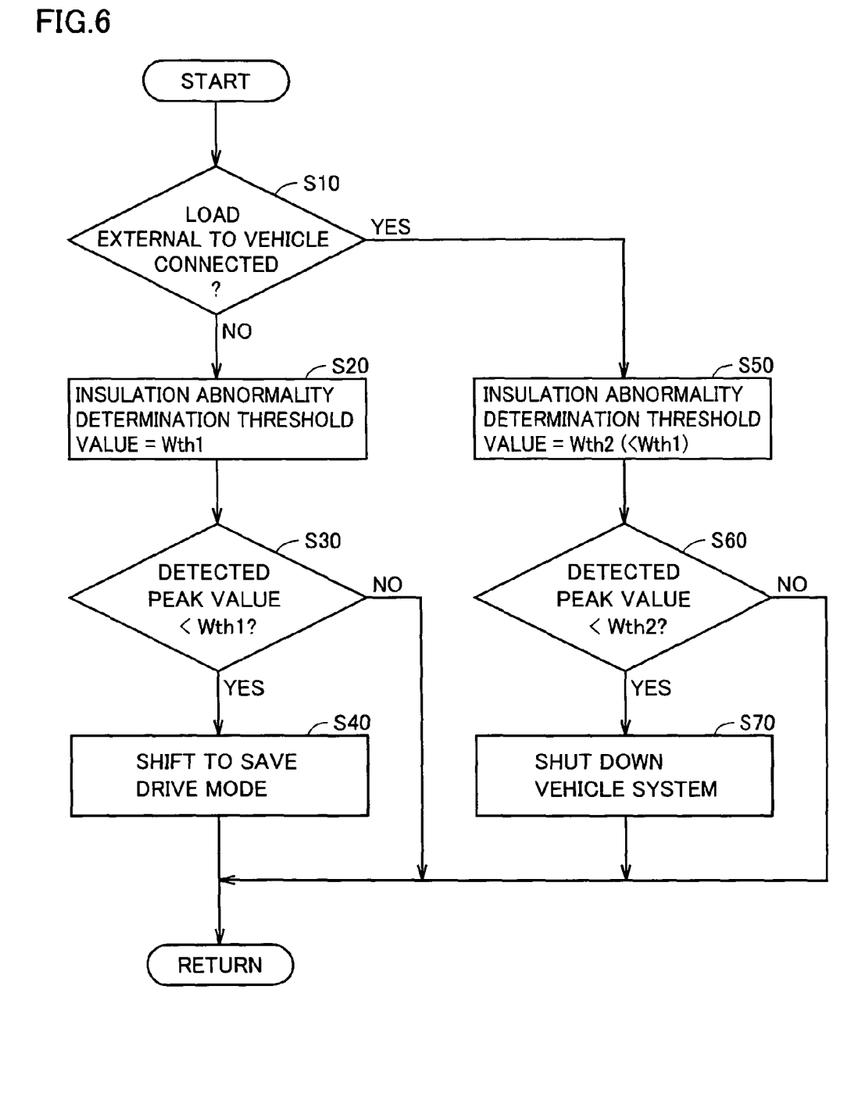
FIG. 6 is a flowchart concerning the abnormality determination control of the insulation resistance by an ECU shown in FIG. 1.

FIG. 6 is a flowchart concerning the abnormality determination control of the insulation resistance by ECU 60 shown in FIG. 1. It is to be noted that the process shown in this flowchart is called from the main routine and executed at regular time intervals or every time the predetermined condition is satisfied.

Referring to FIG. 6, ECU 60 determines based on signal CT from connector 40 whether or not connector 82 of load 80 external to the vehicle is connected to connector 40 (step S10). If ECU 60 determines that signal CT is at L level and connector 82 of load 80 external to the vehicle is not connected to connector 40 (NO in step S10), ECU 60 sets to Wth1 the determination threshold value of the detected peak value for determining that the insulation resistance decreases (step S20).

ECU 60 determines whether or not the detected peak value calculated based on voltage V from insulation resistance decrease detector 50 is less than determination threshold value Wth1 (step S30). If ECU 60 determines that the detected peak value is less than determination threshold value Wth1 (YES in step S30), ECU 60 determines that the insulation resistance decreases and shifts the drive mode from the normal mode to the save drive mode (step S40).

In step S30, if it is determined that the detected peak value is not less than determination threshold value Wth1 (NO in step S30), ECU 60 determines that there is no decrease in the insulation resistance, and terminates a series of processes without shifting the drive mode to the save drive mode.

On the other hand, in step S10, if it is determined that signal CT is at H level and connector 82 of load 80 external to the vehicle is connected to connector 40 (YES in step S10), ECU 60 sets the determination threshold value of the detected peak value for determining that the insulation resistance decreases, to Wth2 which is lower than Wth1 (step S50).

ECU 60 determines whether or not the detected peak value is less than determination threshold value Wth2 (step S60). If ECU 60 determines that the detected peak value is less than determination threshold value Wth2 (YES in step S60), ECU 60 determines that the insulation resistance decreases and shuts down the vehicle system (step S70).

On the other hand, in step S60, if it is determined that the detected peak value is not less than determination threshold values Wth2 (NO in step S60), ECU 60 determines that there is no decrease in the insulation resistance and terminates the series of processes without shutting down the vehicles system.

As described above, in the first embodiment, when load 80 external to the vehicle is not connected to power supply device 100, the decrease in the insulation resistance is detected based on determination threshold value Wth1. When load 80 external to the vehicle is electrically connected to power supply device 100, the decrease in the impedance due to the addition of capacitors C3 and C4 of Y-capacitor 84 is taken into consideration to detect the decrease in the insulation resistance based on determination threshold value Wth2 which is lower than determination threshold value Wth1. Therefore, according to the first embodiment, the decrease in the insulation resistance can be accurately detected.

Furthermore, load 80 external to the vehicle is electrically connected to neutral points N1 and N2 of motor generators MG1 and MG2, and inverters 10 and 20 are each operated as a single-phase PWM inverter or a single-phase PWM converter, to thereby cause transmission and reception of the electric power between power supply device 100 and load 80 external to the vehicle. Consequently, there is no need of an inverter and a converter which are used exclusively for transmission and reception of the electric power between power supply device 100 and load 80 external to the vehicle.

Second Embodiment

During vehicle running (that is, the state where load 80 external to the vehicle is not connected to power supply device 100), power storage device B is charged and discharged frequently, and voltage V from insulation resistance decrease detector 50 varies accordingly. On the other hand, at the time of transmission and reception of the electric power between power supply device 100 and load 80 external to the vehicle (that is, the state where load 80 external to the vehicle is connected to power supply device 100), power storage device B is not frequently charged and discharged as during vehicle running. Therefore, voltage V is stable.

Thus, in the second embodiment, in order to prevent erroneous detection resulting from variations in voltage V, the decrease in the insulation resistance is defined when the decrease in the detected peak value continues for a predetermined period of time. When load 80 external to the vehicle is electrically connected to power supply device 100, the detected peak value is stable. Therefore, the determination period for defining the decrease in the insulation resistance is set to a period shorter than that in the non-connected state.

The entire structure of the power supply device according to the second embodiment is the same as power supply device 100 according to the first embodiment shown in FIG. 1.

Figure 7:
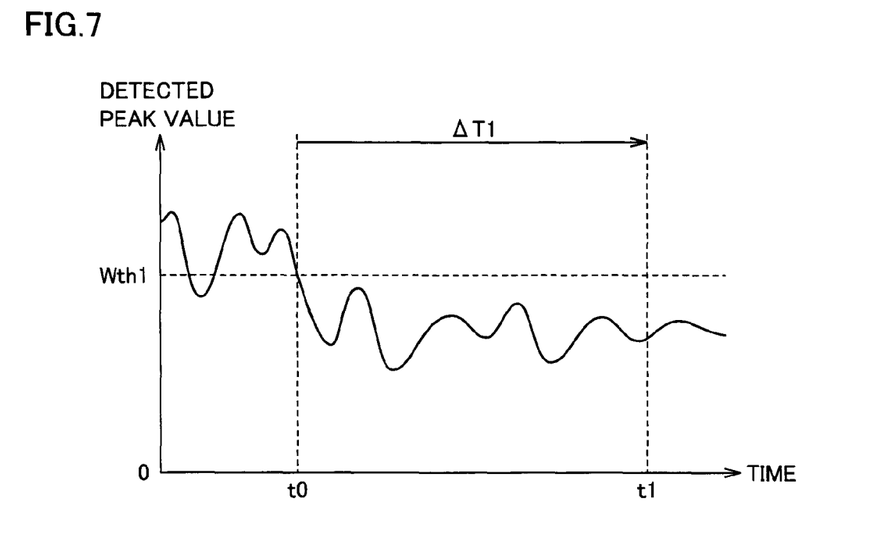
FIG. 7 shows temporal variations of a detected peak value during running of the vehicle to which the load external to the vehicle is not connected.

FIG. 7 shows temporal variations of the detected peak value during running of the vehicle to which load 80 external to the vehicle is not connected. Referring to FIG. 7, during vehicle running, power storage device B is charged and discharged frequently depending on the running state, and voltage of power storage device B varies accordingly. Since insulation resistance decrease detector 50 is connected to ground line SL to which the negative electrode of power storage device B is connected, voltage V from insulation resistance decrease detector 50 also varies in accordance with the voltage variations of power storage device B, and the detected peak value varies as shown in FIG. 7.

Thus, in the second embodiment, in the case where load 80 external to the vehicle is not connected to power supply device 100, when the detected peak value is less than determination threshold value Wth1 continuously for a determination period $\Delta T1$, it is determined that the insulation resistance decreases.

Figure 8:
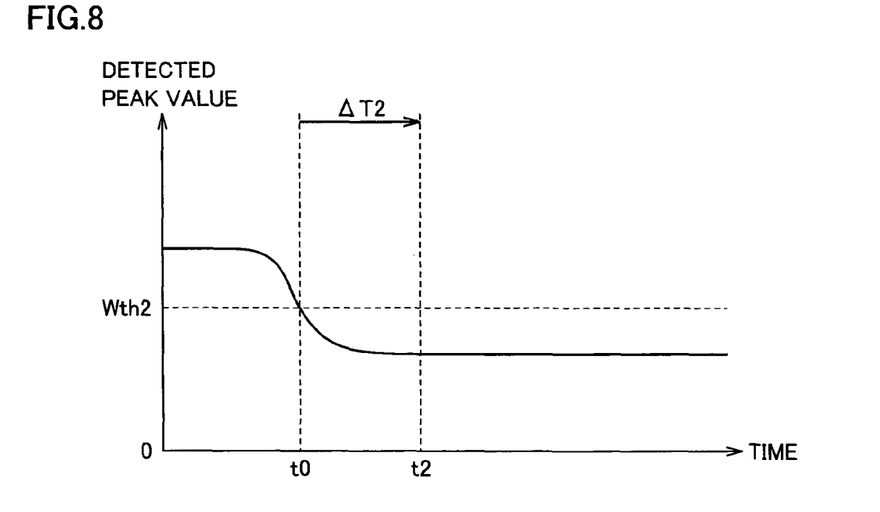
FIG. 8 shows temporal variations of the detected peak value in the case where the load external to the vehicle is electrically connected.

FIG. 8 shows temporal variations of the detected peak value in the case where load 80 external to the vehicle is electrically connected. Referring to FIG. 8, when load 80 external to the vehicle is electrically connected, power storage device B is not frequently charged and discharged as during vehicle running. Therefore, the voltage of power storage device B is stable, and consequently, the detected peak value is also stable.

Thus, in the case where load 80 external to the vehicle is electrically connected to power supply device 100, when the detected peak value is less than determination threshold value Wth2 continuously for a determination period $\Delta T2$ which is shorter than the above-mentioned determination period $\Delta T1$ in the non-connected state, it is determined that the insulation resistance decreases. This results in a reduction in the period required for abnormality detection when load 80 external to the vehicle is electrically connected to power supply device 100.

Figure 9:
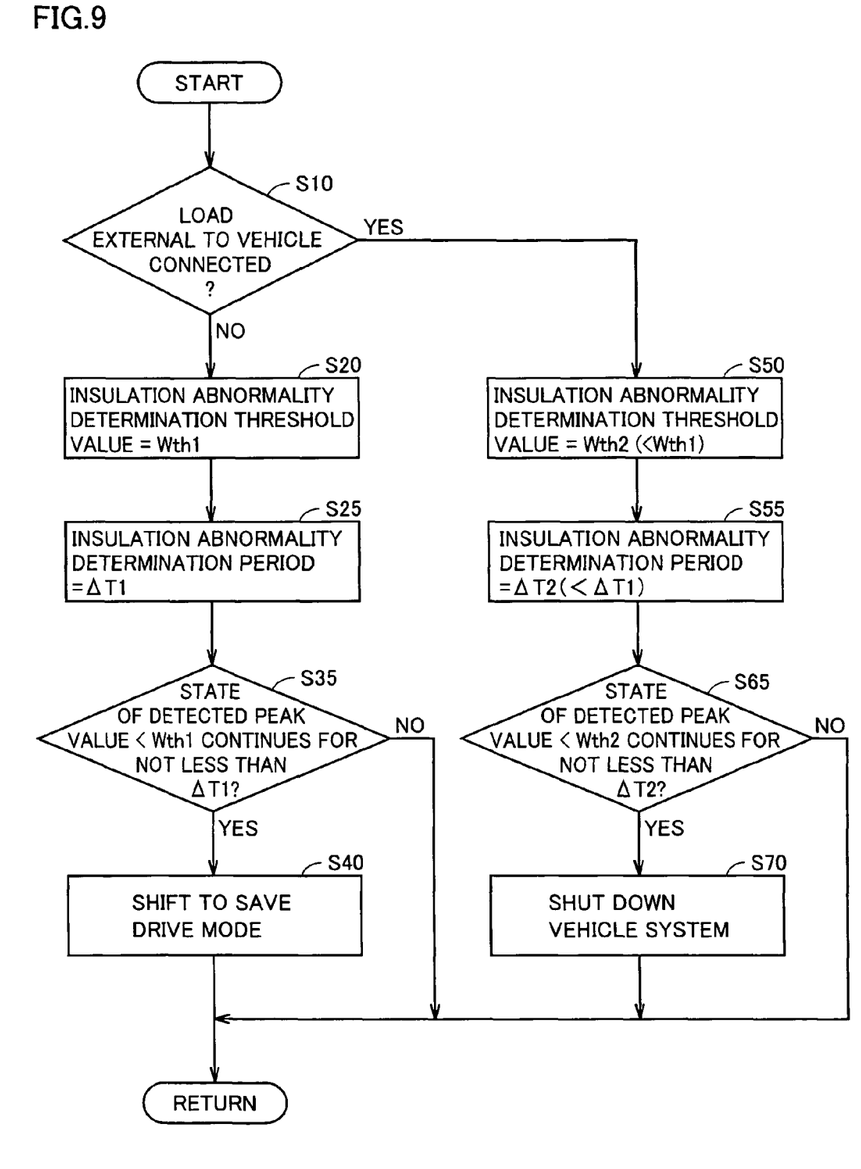
FIG. 9 is a flowchart concerning the abnormality determination control of the insulation resistance by the ECU in a second embodiment.

FIG. 9 is a flowchart concerning the abnormality determination control of the insulation resistance by ECU 60 in the second embodiment. It is to be noted that the process shown in this flowchart is called from the main routine and executed at regular time intervals or every time the predetermined condition is satisfied.

Referring to FIG. 9, this flowchart includes additional steps S25 and S55 in the flowchart shown in FIG. 6, and further includes steps S35 and S65 in place of steps S30 and S60, respectively. In step S20, when the determination threshold value of the detected peak value for determining that the insulation resistance decreases is set to Wth1, ECU 60 sets to $\Delta T1$ the determination period for defining the decrease in the insulation resistance (step S25).

ECU 60 determines whether or not the state where the detected peak value calculated based on voltage V from insulation resistance decrease detector 50 is less than determination threshold value Wth1 continues for not less than determination period $\Delta T1$ (step S35). If ECU 60 determines that the state where the detected peak value is less than determination threshold value Wth1 continues for not less than determination period $\Delta T1$ (YES in step S35), ECU 60 defines the decrease in the insulation resistance and shifts the drive mode from the normal mode to the save drive mode (step S40).

In step S35, if it is determined that the state where the detected peak value is less than determination threshold value Wth1 does not continue for determination period $\Delta T1$ or longer (NO in step S35), ECU 60 determines that there is no decrease in the insulation resistance and terminates the series of processes without shifting the drive mode to the save drive mode.

On the other hand, in step S50, if the determination threshold value of the detected peak value for determining that the insulation resistance decreases is set to Wth2, ECU 60 sets the determination period for defining the decrease in the insulation resistance to $\Delta T2$ which is shorter than $\Delta T1$ (step S55).

ECU 60 determines whether or not the state where the detected peak value is less than determination threshold value Wth2 continues for not less than determination period $\Delta T2$ (step S65). If ECU 60 determines that the state where the detected peak value is less than determination threshold value Wth2 continues for not less than determination period $\Delta T2$ (YES in step S65), ECU 60 defines the decrease in the insulation resistance and shuts down the vehicle system (step S70).

In step S65, if it is determined that the state where the detected peak value is less than determination threshold value Wth2 does not continue for determination period $\Delta T2$ or longer (NO in step S65), ECU 60 determines that there is no decrease in the insulation resistance and terminates the series of processes without shutting down the vehicle system.

As described above, in the second embodiment, in the case where load 80 external to the vehicle is electrically connected to power supply device 100, in consideration of the fact that the detected peak value of voltage V from insulation resistance decrease detector 50 is more stable than in the non-connected state, determination period $\Delta T2$ for defining the decrease in the insulation resistance is set to a period shorter than determination period ΔT1 in the non-connected state. Therefore, according to the second embodiment, if abnormality including the insulation resistance decrease occurs when load 80 external to the vehicle is electrically connected to power supply device 100, the abnormality can be detected at an early stage.

In each of the above-described first and second embodiments, the electric power is transmitted and received between load 80 external to the vehicle and power supply device 100 through neutral points N1 and N2 of motor generators MG1 and MG2. The present invention can also be applied to the system provided with the inverter and converter which are used exclusively for transmission and reception of the electric power between load 80 external to the vehicle and power supply device 100.

Although power storage device B is a secondary battery in the above description, it may be a fuel cell instead. Although power supply device 100 is incorporated in a hybrid vehicle in the above description, the scope of application of the present invention is not limited to the power supply device incorporated in the hybrid vehicle, and may include those incorporated in an electric vehicle and a fuel cell vehicle.

In the above description, a boost converter for boosting a DC voltage from power storage device B and supplying the boosted voltage to inverters 10 and 20 may be provided between power storage device B and inverters 10 and 20.

In the above description, inverters 10 and 20, motor generators MG1 and MG2, and ECU 60 form the "electric power conversion device" of the present invention, and insulation resistance decrease detector 50 and ECU 60 form the "detection device" of the present invention. Furthermore, load 80 external to the vehicle and Y-capacitor 84 form the "load external to the vehicle" of the present invention, and the process performed by ECU 60 in step S70 corresponds to the process performed by the "shutdown unit" of the present invention. Y-capacitor 84 corresponds to the "line-bypass capacitor" of the present invention.

Resistance element RD corresponds to the "resistance element" of the present invention, and square-wave generator 52 corresponds to the "voltage generating device" of the present invention. Capacitor CD corresponds to the "capacitive element" of the present invention, and voltage sensor 54 corresponds to the "voltage detection device" of the present invention. The processes performed by ECU 60 in steps S20 and S50 correspond to the processes performed by the "setting unit" of the present invention, and the processes performed by ECU 60 in steps S30, S60, S35, and S65 correspond to the processes performed by the "determination unit" of the present invention.

Furthermore, motor generators MG1 and MG2 correspond to the "first and second AC electric motors" of the present invention, respectively, and inverters 10 and 20 correspond to the "first and second inverters" of the present invention, respectively. ECU 60 corresponds to the "inverter control device" of the present invention, and AC lines ACL1 and ACL2, relay circuit 30, and connector 40 form the "connecting device" of the present invention.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A power supply device incorporated in an electrically-driven vehicle, comprising:

a power storage device;

an electric power conversion device configured to allow at least one of power feeding from said power storage device to a load external to the vehicle and charging from said load to said power storage device to be performed; and detection means for detecting a decrease in insulation resistance of the power supply device, said detection means, when said load is connected to said electric power conversion device, setting a determination threshold value for detecting the decrease in said insulation resistance to a value lower than the determination threshold value in a non-connected state of said load to said electric power conversion device.

2. The power supply device according to claim 1, wherein the determination threshold value when said load is connected to said electric power conversion device is determined based on a capacitance of said load.

3. The power supply device according to claim 1, wherein when said load is connected to said electric power conversion device, said detection means sets a determination period for defining the decrease in said insulation resistance to a period shorter than the determination period in the non-connected state.

4. The power supply device according to claim 1, further comprising means for shutting down a system of said electrically-driven vehicle when the decrease in said insulation resistance is detected in a case where said load is connected to said electric power conversion device.

5. The power supply device according to claim 1, wherein said load includes a line-bypass capacitor connected between ground and a power line pair connected to said electric power conversion device.

6. The power supply device according to claim 1, wherein said detection means includes a resistance element having a predetermined resistance value, a voltage generating device connected between said resistance element and vehicle ground and generating a voltage having a predetermined frequency, a capacitive element connected between said resistance element and an electric power line of the power supply device, a voltage detection device detecting a voltage between said resistance element and said capacitive element, a setting unit setting said determination threshold value, and a determination unit determining that said insulation resistance decreases, based on the voltage detected by said voltage detection device and the determination threshold value set by said setting unit.

7. The power supply device according to claim 1, wherein said electric power conversion device includes first and second AC electric motors each having a star-connected polyphase winding as a stator winding, first and second inverters provided corresponding to said first and second AC electric motors, respectively, and transmitting and receiving electric power to and from said power storage device, an inverter control device controlling said first and second inverters, and a connecting device for connecting said load to a neutral point of said polyphase winding when one of power feeding from said power storage device to said load and charging from said load to said power storage device is performed.

8. An electrically-driven vehicle incorporating the power supply device according to claim 1.

9. A method of controlling a power supply device incorporated in an electrically-driven vehicle,
said power supply device including
a power storage device,
an electric power conversion device configured to allow at least one of power feeding from said power storage device to a load external to the vehicle and charging from said load to said power storage device to be performed, and
a detection device detecting a decrease in insulation resistance of the power supply device,
said control method comprising:
a first step of determining whether or not said load is connected to said electric power conversion device; and
a second step of, when it is determined that said load is connected to said electric power conversion device, setting a determination threshold value for detecting the decrease in said insulation resistance to a value lower than the determination threshold value in a non-connected state of said load to said electric power conversion device.

10. The control method of the power supply device according to claim 9, wherein the determination threshold value when said load is connected to said electric power conversion device is determined based on a capacitance of said load.

11. The control method of the power supply device according to claim 9, further comprising a third step of, when it is determined that said load is connected to said electric power conversion device, setting a determination period for defining the decrease in said insulation resistance to a period shorter than the determination period in the non-connected state.

12. The control method of the power supply device according to claim 9, further comprising a fourth step of, when said detection device detects the decrease in said insulation resistance in a case where said load is connected to said electric power conversion device, shutting down a system of said electrically-driven vehicle.

13. An electrically-driven vehicle incorporating the power supply device according to claim 2.

14. An electrically-driven vehicle incorporating the power supply device according to claim 3.

15. An electrically-driven vehicle incorporating the power supply device according to claim 4.

16. An electrically-driven vehicle incorporating the power supply device according to claim 5.

17. An electrically-driven vehicle incorporating the power supply device according to claim 6.

18. An electrically-driven vehicle incorporating the power supply device according to claim 7.

* * * * *